US012604728B2

(12) United States Patent
Stewart et al.

(10) Patent No.: US 12,604,728 B2
(45) Date of Patent: Apr. 14, 2026

(54) INTEGRATED CIRCUIT (IC) DIE COMPRISING GALVANIC ISOLATION CAPACITOR

(71) Applicant: TEXAS INSTRUMENTS INCORPORATED, Dallas, TX (US)

(72) Inventors: Elizabeth Stewart, Dallas, TX (US);
Jeffrey Alan West, Dallas, TX (US);
Byron Williams, Plano, TX (US);
Pijush Kanti Ghosh, Sachse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 331 days.

(21) Appl. No.: 17/936,316

(22) Filed: Sep. 28, 2022

(65) Prior Publication Data

US 2023/0369198 A1 Nov. 16, 2023

Related U.S. Application Data

(60) Provisional application No. 63/341,451, filed on May 13, 2022.

(51) Int. Cl.
| | |
|---|---|
| *H01L 23/522* | (2006.01) |
| *H01L 21/768* | (2006.01) |
| *H01L 23/00* | (2006.01) |
| *H01L 23/528* | (2006.01) |
| *H01L 23/532* | (2006.01) |
| *H01L 25/065* | (2023.01) |

(52) U.S. Cl.
CPC .... *H01L 23/5223* (2013.01); *H01L 21/76832* (2013.01); *H01L 23/5226* (2013.01); *H01L 23/5283* (2013.01); *H01L 23/53295* (2013.01);

*H01L 24/48* (2013.01); *H01L 25/0655* (2013.01); *H01L 2224/48101* (2013.01); *H01L 2224/48138* (2013.01); *H01L 2924/1205* (2013.01)

(58) Field of Classification Search
CPC ............. H01L 23/5223; H01L 23/5226; H01L 23/5283; H01L 23/53295; H01L 21/76832; H01L 24/48; H01L 25/0655; H01L 2224/48101; H01L 2224/48138; H01L 2924/1205
USPC ......................................................... 257/532
See application file for complete search history.

(56) References Cited

U.S. PATENT DOCUMENTS

| | | | |
|---|---|---|---|
| 10,147,784 B2 | 12/2018 | West et al. | |
| 11,348,883 B2 * | 5/2022 | West ................... | H01L 23/5226 |

(Continued)

*Primary Examiner* — Tu-Tu V Ho
(74) *Attorney, Agent, or Firm* — Andrew R. Ralston; Frank D. Cimino

(57) ABSTRACT

The present disclosure generally relates to a capacitor on an integrated circuit (IC) die. In an example, a package includes first and second IC dice. The first IC die includes a first circuit, a capacitor, and a polyimide layer. The first circuit is on a substrate. The capacitor includes a bottom plate over the substrate and a top plate over the bottom plate. The polyimide layer is at least partially over the top plate. A distance from a top surface of the top plate to a bottom surface of the polyimide layer is at least 30% of a distance from a top surface of the bottom plate to a bottom surface of the top plate. A signal path, including the capacitor, is electrically coupled between the first circuit and a second circuit in the second IC die, which does not include a galvanic isolation capacitor in the signal path.

20 Claims, 15 Drawing Sheets

(56) References Cited

U.S. PATENT DOCUMENTS

| | | | |
|---|---|---|---|
| 11,784,212 B2 * | 10/2023 | Bonifield | H01L 23/5223 |
| | | | 257/532 |
| 2019/0206812 A1 | 7/2019 | Bonifield et al. | |
| 2019/0378892 A1 | 12/2019 | Stewart et al. | |
| 2021/0305178 A1 | 9/2021 | West | |

* cited by examiner

INTEGRATED CIRCUIT (IC) DIE COMPRISING GALVANIC ISOLATION CAPACITOR

CROSS-REFERENCE TO RELATED APPLICATIONS

This application claims priority to and the benefit of U.S. Provisional Patent Application Ser. No. 63/341,451, filed on May 13, 2022, which is hereby incorporated herein by reference in its entirety.

BACKGROUND

Galvanic isolation generally relates to isolating functional sections of electrical circuits or systems to prevent direct current (DC) current flow between those functional sections. Alternating current (AC) signals can still be exchanged between the sections of the electrical circuits or systems by other means, such as capacitive inductive, or others. Galvanic isolation may be used where two or more electric circuits are configured to communicate with each other. However, preventing a DC current loop between the two or more electric circuits may be desirable, such as for example, when the electric circuits have ground nodes at different potentials. Galvanic isolation can be an effective method of breaking ground loops by preventing unwanted DC current from flowing between electrical circuits.

SUMMARY

An example described herein is an integrated circuit (IC) package. The IC package includes a first IC die and a second IC die. The first IC die includes a first circuit, a capacitor, and a polyimide layer. The first circuit is disposed on a first semiconductor substrate. The capacitor includes a bottom plate and a top plate. The bottom plate is disposed over the first semiconductor substrate, and the top plate is disposed over the bottom plate. A first distance is from a top surface of the bottom plate to a bottom surface of the top plate. The polyimide layer is disposed at least partially over the top plate of the capacitor. A second distance is from a top surface of the top plate to a bottom surface of the polyimide layer. The second distance is equal to or greater than 30% of the first distance. The second IC die includes a second circuit disposed on a second semiconductor substrate. A signal path is electrically coupled between the first circuit and the second circuit. The signal path includes the capacitor, and the second IC die does not include a galvanic isolation capacitor in the signal path.

Another example described herein is a method of semiconductor processing. A first capacitor plate is formed on a first interlayer dielectric (ILD). The first ILD is disposed over a semiconductor substrate. A second capacitor plate is formed on a second ILD. The second ILD is disposed over the first capacitor plate and the first ILD. A first distance is from a top surface of the first capacitor plate to a bottom surface of the second capacitor plate. The first distance is equal to or greater than 15 μm. A polyimide layer is formed over the second capacitor plate and the second ILD. A second distance is from a top surface of the second capacitor plate to a bottom surface of the polyimide layer. The second distance is equal to or greater than 30% of the first distance.

A further example described herein is an IC die. The IC die includes a galvanic isolation capacitor and a polyimide layer. The galvanic isolation capacitor includes a bottom plate over a semiconductor substrate and a top plate over the bottom plate. A first distance is from a top surface of the bottom plate to a bottom surface of the top plate. The first distance is equal to or greater than 15 μm. The polyimide layer is over the top plate of the galvanic isolation capacitor. A second distance is from a top surface of the top plate to a bottom surface of the polyimide layer. The second distance is equal to or greater than 30% of the first distance.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
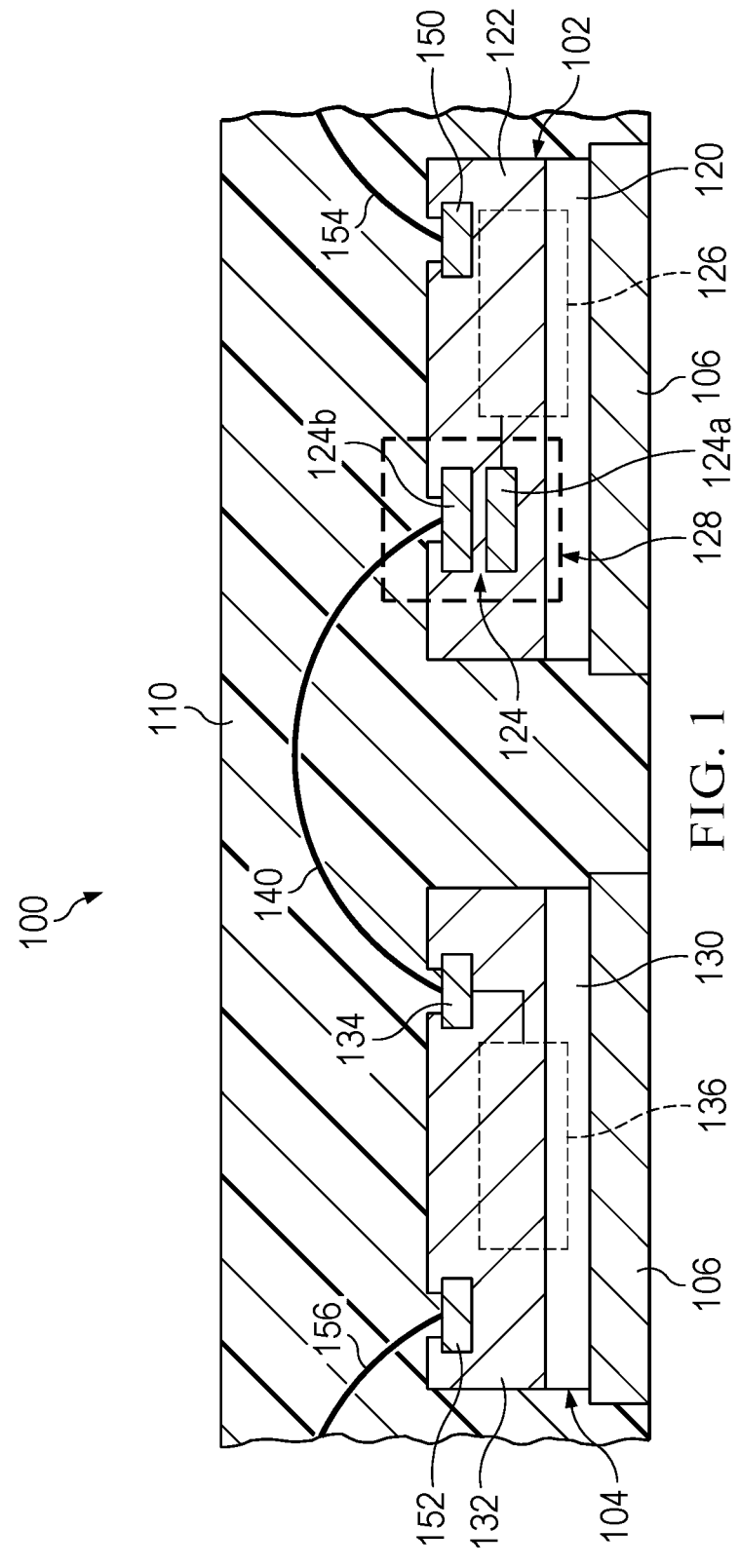
FIG. 1 is a partial cross-sectional view of an integrated circuit (IC) package according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure relates to a capacitor on an integrated circuit (IC) die, and more particularly, a galvanic isolation capacitor on an IC die. The IC die with the capacitor can be packaged in an IC package with another IC die. The IC die with the capacitor includes an outer poly-imide layer. In some examples, a distance between capacitor plates of the capacitor is equal to or greater than 15 μm, and a distance from a top surface of the capacitor top plate to a bottom surface of the polyimide layer is equal to or greater than 30% (or, more particularly, equal to or greater than 32% and/or 37%) of the distance between the capacitor plates of the capacitor. In some examples, the capacitor top plate is in an uppermost metal level in the IC die. Further, the capacitor top plate may be a bond pad for a wire bond.

In situations where a galvanic isolation capacitor is implemented in an IC die, particularly, a high voltage (HV) application, a failure mode has been observed where the system may break down due to a relatively high electric field. In some examples, having the distance from the top surface of the capacitor top plate to the bottom surface of the polyimide layer as noted previously can reduce the electric field peaks in the system. This can reduce the likelihood of breakdown and early lifetime failures. Other variations are also described that may reduce the likelihood of system breakdown, among other things. Other advantages or benefits can be achieved using various aspects described herein.

Specific examples described subsequently are described in the context of an IC package using a leadframe and wire bonding, such as for a quad flat package (QFP), small outline package (SOP), or the like. It will be apparent to those of ordinary skill in the art that a galvanic isolation capacitor implemented consistent with this disclosure may be implemented in other types of IC packages, such as a ball grid array (BGA) package, chip scale package (CSP), or the like.

FIG. 1 is a partial cross-sectional view of an IC package 100 according to some examples. The IC package 100 includes a first IC die 102 and a second IC die 104. The first IC die 102 and the second IC die 104 are attached to a leadframe 106. The first IC die 102 and the second IC die 104 may be attached to the leadframe 106 by an adhesive. A molding compound 110 encapsulates the first IC die 102 and the second IC die 104 on leadframe 106.

The first IC die 102 includes a semiconductor substrate 120 and a metallization structure 122 over the semiconductor substrate 120. The semiconductor substrate 120 can be any semiconductor material and can include a bulk material (e.g., bulk silicon) and one or more epitaxial layers of a semiconductor material. The metallization structure 122 can include multiple interlayer dielectrics (ILDs) and metal levels (METs). The metallization structure 122 of the first IC die 102 includes a capacitor 124, which may be a galvanic isolation capacitor. The capacitor 124 includes a capacitor bottom plate 124*a* disposed in a MET and a capacitor top plate 124*b* disposed in another MET. The capacitor bottom plate 124*a* is electrically connected to a circuit 126 in the first IC die 102. The circuit 126 is on the semiconductor substrate 120. The circuit 126 can include one or more devices disposed in, over, and/or on the semiconductor substrate 120 and can include electrical connections, such as by metal contacts, metal lines, and/or metal vias in the metallization structure 122. A cross-section portion 128 of the first IC die 102 is generally identified in FIG. 1 and is detailed subsequently in FIG. 2.

Similarly, the second IC die 104 includes a semiconductor substrate 130 and a metallization structure 132 over the semiconductor substrate 130. The semiconductor substrate 130 can be any semiconductor material and can include a bulk material (e.g., bulk silicon) and one or more epitaxial layers of a semiconductor material. The metallization structure 132 can include multiple ILDs and METs. The metallization structure 132 includes a bond pad 134 in an uppermost MET. The second IC die 104 includes a circuit 136 on the semiconductor substrate 130. The bond pad 134 is electrically connected to the circuit 136. The circuit 136 can include one or more devices disposed in, over, and/or on the semiconductor substrate 130 and can include electrical connections, such as by metal contacts, metal lines, and/or metal vias in the metallization structure 132.

The capacitor top plate 124*b* of the first IC die 102 is bonded to a wire 140, and hence, the capacitor top plate 124*b* may further be a bond pad. The wire 140 is further bonded to the bond pad 134 of the second IC die 104. Accordingly, the capacitor 124 is electrically coupled between the circuit 126 in the first IC die 102 and the circuit 136 in the second IC die 104 (via the wire 140 and bond pad 134). The capacitor 124 may be a direct current (DC) current stop between the circuit 126 in the first IC die 102 and the circuit 136 in the second IC die 104. Hence, the capacitor 124 can provide a level of isolation between the circuit 126 in the first IC die 102 and the circuit 136 in the second IC die 104.

Generally, a signal path is disposed between the circuit 126 in the first IC die 102 and the circuit 136 in the second IC die 104. The signal path includes the capacitor 124, the wire 140, and the bond pad 134. In some examples, the second IC die 104 does not include a capacitor in the signal path between the circuits 126, 136. The second IC die 104 does not include a galvanic isolation capacitor between the circuits 126, 136. As illustrated and as in some examples, in the IC package 100, the first IC die 102 is the only IC die to provide a galvanic isolation capacitance (e.g., by the capacitor 124) between the circuit 126 in the first IC die 102 and the circuit 136 in the second IC die 104.

The first IC die 102 and second IC die 104 can include other bond pads (e.g., bond pads 150, 152) to which wires (e.g., wires 154, 156) are bonded. Although not specifically illustrated, some wires may further be bonded to leads of the leadframe 106, which can provide for external electrical connectors external to the IC package 100.

Figure 2:
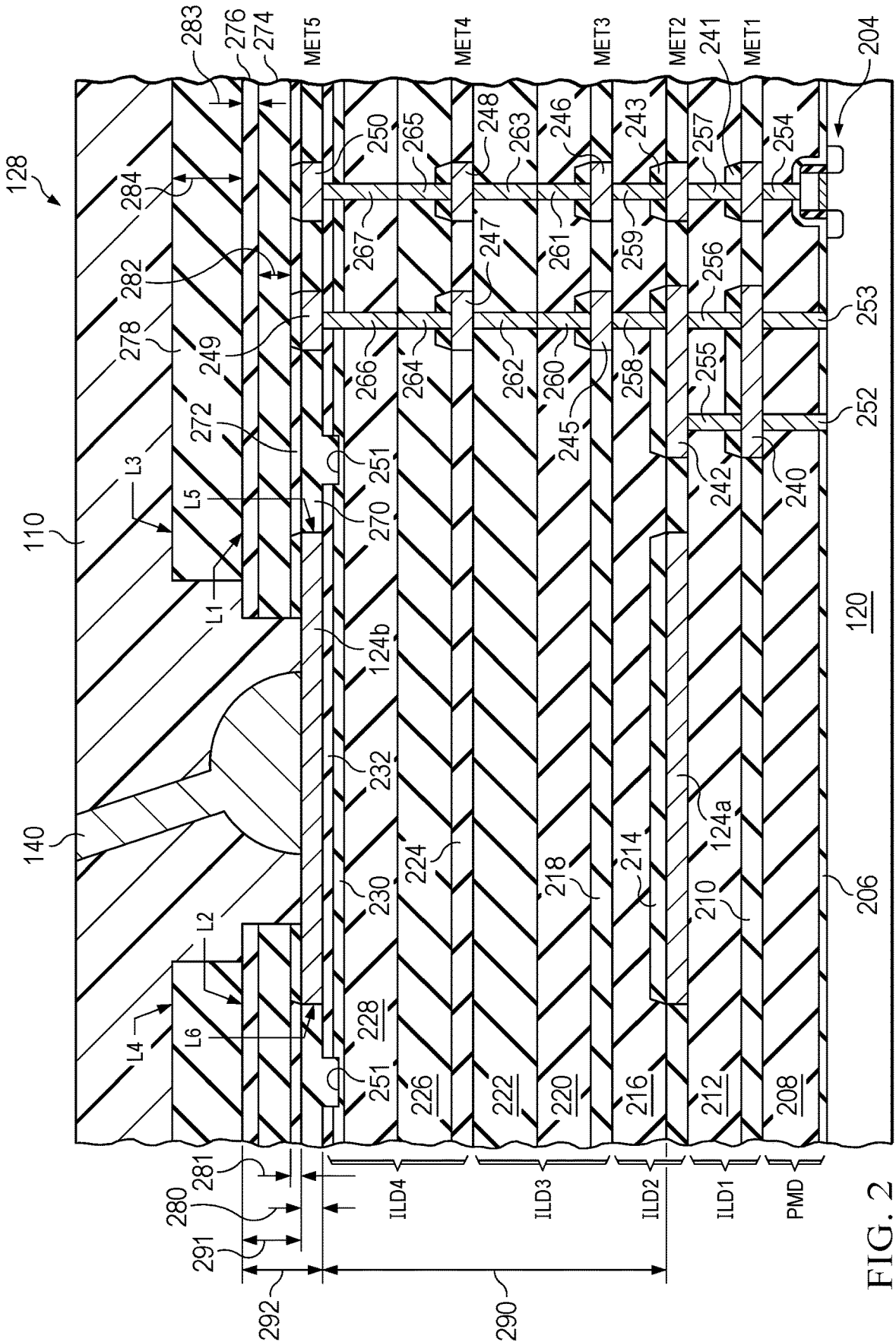
FIG. 2 is a cross-section portion of an IC die in the IC package of FIG. 1 according to some examples.

FIG. 2 is the cross-section portion 128 of the first IC die 102 in the IC package 100 according to some examples. The first IC die 102 includes the semiconductor substrate 120 in, on, and/or over which one or more semiconductor devices (e.g., transistor 204) are formed. The semiconductor substrate 120 can be or include a bulk semiconductor substrate (e.g., a silicon substrate), a semiconductor on insulator (SOI) substrate, or the like, and may include one or more layers of epitaxial semiconductor material. The first IC die 102 includes a pre-metal dielectric (PMD) over the semiconductor substrate 120. The PMD includes a conformal dielectric layer 206 (e.g., an etch stop layer) over (e.g., possibly, on) the semiconductor substrate 120 and a dielectric layer 208 over the conformal dielectric layer 206. In some examples, the conformal dielectric layer 206 is or includes silicon nitride, silicon oxynitride, the like, or a combination thereof, and the dielectric layer 208 is or includes phosphosilicate glass (PSG), the like, or a combination thereof.

The first IC die 102 further includes a first interlayer dielectric (ILD1), a second ILD (ILD2), a third ILD (ILD3), and a fourth ILD (ILD4). The ILD1 is over the PMD. The ILD2 is over the ILD1, and the ILD3 is over the ILD2. The ILD4 is over the ILD3. The ILD1 includes a first dielectric sub-layer 210 over the PMD and a second dielectric sub-layer 212 over the first dielectric sub-layer 210. The ILD2 includes a first dielectric sub-layer 214 over the second dielectric sub-layer 212 and a second dielectric sub-layer 216 over the first dielectric sub-layer 214. The ILD3 includes a first dielectric sub-layer 218 over the second dielectric sub-layer 216, a second dielectric sub-layer 220 over the first dielectric sub-layer 218, and a third dielectric sub-layer 222 over the second dielectric sub-layer 220. The ILD4 includes a first dielectric sub-layer 224 over the third dielectric sub-layer 222, a second dielectric sub-layer 226 over the first dielectric sub-layer 224, a third dielectric sub-layer 228 over the second dielectric sub-layer 226, a fourth dielectric sub-layer 230 over the third dielectric sub-layer 228, and a fifth dielectric sub-layer 232 over the fourth dielectric sub-layer 230. In some examples, the first dielectric sub-layers 210, 214, 218, 224 each are or include a high density plasma (HDP) silicon oxide ($SiO_x$) or the like, and the second dielectric sub-layers 212, 216, 220, 226 and the third dielectric sub-layers 222, 228 each are or include tetraethyl orthosilicate (TEOS) or the like. In some examples, the fourth dielectric sub-layer 230 is or includes silicon oxynitride or the like, and the fifth dielectric sub-layer 232 is or includes silicon nitride or the like.

The first IC die 102 includes a first metal level (MET1), a second metal level (MET2), a third metal level (MET3), a fourth metal level (MET4), and a fifth metal level (MET5). The MET1 includes metal lines 240, 241. The metal lines 240, 241 are disposed over (e.g., possibly, on) or in other examples, in, the dielectric layer 208 of the PMD. The first dielectric sub-layer 210 of the ILD1 is disposed over the metal lines 240, 241 of the MET1.

The MET2 includes metal lines 242, 243 and the capacitor bottom plate 124a. The metal lines 242, 243 and capacitor bottom plate 124a are disposed over, or in other examples, in, the second dielectric sub-layer 212 of the ILD1. The first dielectric sub-layer 214 of the ILD2 is disposed over the metal lines 242, 243 and capacitor bottom plate 124a of the MET2. In other examples, the capacitor bottom plate 124a can be in another metal level.

The MET3 includes metal lines 245, 246. The metal lines 245, 246 are disposed over, or in other examples, in, the second dielectric sub-layer 216 of the ILD2. The first dielectric sub-layer 218 of the ILD3 is disposed over the metal lines 245, 246 of the MET3. The MET4 includes metal lines 247, 248. The metal lines 247, 248 are disposed over, or in other examples, in, the third dielectric sub-layer 222 of the ILD3. The first dielectric sub-layer 224 of the ILD4 is disposed over the metal lines 247, 248 of the MET4.

The MET5 includes metal lines 249, 250 and the capacitor top plate 124b. The metal lines 249, 250 and capacitor top plate 124b are disposed over, or in other examples, in, the fifth dielectric sub-layer 232 and/or another dielectric sub-layer of the ILD4. MET5, and hence, the capacitor top plate 124b, has a thickness 280, which in some examples, may be in a range from 0.5 μm to 4.0 μm, and more particularly, from 1.5 μm to 3.0 μm. In the illustrated example, the MET5 is the uppermost metal level distal from the semiconductor substrate 120, although in other examples, additional or fewer metal levels may be included, e.g., over the MET5. The capacitor top plate 124b is in a metal level over the capacitor bottom plate 124a. In other examples, the capacitor top plate 124b can be in another metal level. The capacitor bottom plate 124a and the capacitor top plate 124b form a capacitor, such as a galvanic isolation capacitor.

A trench 251 is in the ILD4. The trench 251 laterally circumscribes the capacitor top plate 124b. In the illustrated example, the trench 251 extends from a top surface of the ILD4 (e.g., the top surface of the fifth dielectric sub-layer 232) through the fifth dielectric sub-layer 232 and into the fourth dielectric sub-layer 230. The trench 251, as illustrated, extends to a depth to approximately a midpoint of the thickness of the fourth dielectric sub-layer 230. The trench 251 can extend to other depths in other examples. The trench 251, in some examples, can have a lateral width in a range from 5 μm to 50 μm.

The first IC die 102 includes metal contacts 252-254 and metal vias 255-267 that electrically connect various components or metal lines. Metal contacts 252, 253 extend through the PMD (e.g., conformal dielectric layer 206 and dielectric layer 208) and contact the semiconductor substrate 120 and the metal line 240. Metal contact 254 extends through the PMD (e.g., conformal dielectric layer 206 and dielectric layer 208) and contacts a gate electrode of the transistor 204 and the metal line 241. Metal vias 255, 256 extend through the ILD1 (e.g., dielectric sub-layers 210, 212) and contact the metal lines 240, 242. Metal via 257 extends through the ILD1 (e.g., dielectric sub-layers 210, 212) and contacts the metal lines 241, 243. Metal via 258 extends through the ILD2 (e.g., dielectric sub-layers 214, 216) and contacts the metal lines 242, 245. Metal via 259 extends through the ILD2 (e.g., dielectric sub-layers 214, 216) and contacts the metal lines 243, 246.

Metal via 260 extends through the first dielectric sub-layer 218 and second dielectric sub-layer 220 of the ILD3 and contacts the metal line 245 and metal via 262. Metal via 261 extends through the first dielectric sub-layer 218 and second dielectric sub-layer 220 of the ILD3 and contacts the metal line 246 and metal via 263. Metal via 262 extends through the third dielectric sub-layer 222 of the ILD3 and contacts the metal line 247 and metal via 260. Metal via 263 extends through the third dielectric sub-layer 222 of the ILD3 and contacts the metal line 248 and metal via 261. Metal via 264 extends through the first dielectric sub-layer 224 and second dielectric sub-layer 226 of the ILD4 and contacts the metal line 247 and metal via 266. Metal via 265 extends through the first dielectric sub-layer 224 and second dielectric sub-layer 226 of the ILD4 and contacts the metal line 248 and metal via 267. Metal via 266 extends through the third dielectric sub-layer 228, fourth dielectric sub-layer 230, and fifth dielectric sub-layer 232 of the ILD4 and contacts the metal line 249 and metal via 264. Metal via 267 extends through the third dielectric sub-layer 228, fourth dielectric sub-layer 230, and fifth dielectric sub-layer 232 of the ILD4 and contacts the metal line 250 and metal via 265.

The metal lines 240-243, 245-250, capacitor plates 124a, 124b, metal contacts 252-254, and metal vias 255-267 each is or includes a metal. For example, each may be or include aluminum (Al), copper (Cu), tungsten (W), a combination thereof, or the like. Further, each may include a barrier and/or adhesion layer, such as titanium (Ti), titanium nitride (TiN), tantalum nitride (TaN), the like, or a combination thereof.

The metal lines and metal vias illustrated in FIG. 2 are shown as an example and may be configured in any arrangement, including more or fewer metal lines and/or metal vias. Metal lines 241, 243, 246, 248, 250, metal vias 257, 259, 261, 263, 265, 267, and metal contact 254 show an arrangement of metal lines and metal vias that electrically connect between a gate electrode of the transistor 204, for example, and the MET5. Metal lines 240, 242, 245, 247, 249, metal vias 255, 256, 258, 260, 262, 264, 266, and metal contacts 252, 253 can form at least a portion of a ground ring that laterally encircles the capacitor 124 formed by the capacitor bottom plate 124a and capacitor top plate 124b. The ground ring may be connected to an electrical ground node, and may be electrically connected to the semiconductor substrate 120 and the MET5.

The first IC die 102 includes an over-layer dielectric disposed over the MET5 and the ILD4. The over-layer dielectric includes a first dielectric sub-layer 270 and a second dielectric sub-layer 272. The first dielectric sub-layer 270 is disposed over the MET5 (e.g., the metal lines 249, 250 and capacitor top plate 124b) and the ILD4 (e.g., the fifth dielectric sub-layer 232). The first dielectric sub-layer 270 fills the trench 251 in the ILD4. The second dielectric sub-layer 272 is disposed at least partially over the first dielectric sub-layer 270. Respective top surfaces of the first dielectric sub-layer 270 and the second dielectric sub-layer 272 may be co-planar. The over-layer dielectric has a thickness 281 from a top surface of the MET5 (e.g., the capacitor top plate 124b) to a top surface of the over-layer dielectric. The thickness 281 may be in a range from 0.5 μm to 3.0 μm, and more particularly, from 1.1 μm to 1.7 μm. In some examples, the first dielectric sub-layer 270 is or includes a HDP $SiO_x$ or the like, and the second dielectric sub-layer 272 is or includes TEOS or the like.

The first IC die 102 includes one or more buffer dielectric layers 274, a passivation dielectric layer 276, and a polyimide layer 278. The buffer dielectric layer(s) 274 is disposed over the over-layer dielectric (e.g., the first dielectric sub-layer 270 and/or second dielectric sub-layer 272). The buffer dielectric layer(s) 274 is described in detail with respect to subsequent figures. The buffer dielectric layer(s) 274 has a thickness 282, which in some examples, may be in a range from 3.0 μm to 5.0 μm, and more particularly, from 3.2 μm to 3.8 μm. The passivation dielectric layer 276 is disposed over the buffer dielectric layer(s) 274. The passivation dielectric layer 276 has a thickness 283, which in some examples, may be in a range from 0.5 μm to 3.0 μm, and more particularly, from 0.7 μm to 0.9 μm. In some examples, the passivation dielectric layer 276 is or includes a nitrogen-containing dielectric layer, such as silicon oxynitride, silicon nitride, or the like. The polyimide layer 278 is disposed over the passivation dielectric layer 276. The polyimide layer 278 has a thickness 284, which in some examples, may be in a range from 5 μm to 30 μm, and more particularly, from 16 μm to 24 μm.

An opening is through the polyimide layer 278, the passivation dielectric layer 276, the buffer dielectric layer(s) 274, and over-layer dielectric (e.g., the first dielectric sub-layer 270 and/or second dielectric sub-layer 272) to the capacitor top plate 124b. A wire 140 is bonded to the capacitor top plate 124b through the opening. A molding compound 110 encapsulates the first IC die 102 (and the second IC die 104) and the wire 140.

A distance 290 is from a top surface of the capacitor bottom plate 124a to a bottom surface of the capacitor top plate 124b. The distance 290 is generally normal to the top and bottom surfaces of the capacitor bottom plate 124a and capacitor top plate 124b, respectively. The distance 290 is also generally the thickness of the stack of dielectric layers between the capacitor bottom plate 124a and the capacitor top plate 124b. In some examples, the distance 290 is equal to or greater than 15 μm. In some instances, having the distance 290 be at least 15 μm can permit the capacitor 124 to be implemented for an HV application, such as when galvanic isolation capacitance between circuits is provided for on one IC die.

A distance 291 is from a top surface of the capacitor top plate 124b to a bottom surface of the polyimide layer 278. In some examples, the distance 291 is generally normal to the top and bottom surfaces of the capacitor top plate 124b and the polyimide layer 278, respectively. In some examples, the distance 291 is equal to or greater than 30% of the distance 290, and more particularly, equal to or greater than 32% of the distance 290, and even further, is equal to or greater than 37% of the distance 290. In some examples, the distance 291 is in a range from 30% to 38% of the distance 290, and more particularly, is in a range from 32% to 34% of the distance 290. Additionally, a distance 292 (e.g., parallel to the distance 291) is from the bottom surface of the capacitor top plate 124b to the bottom surface of the polyimide layer 278.

Figure 3:
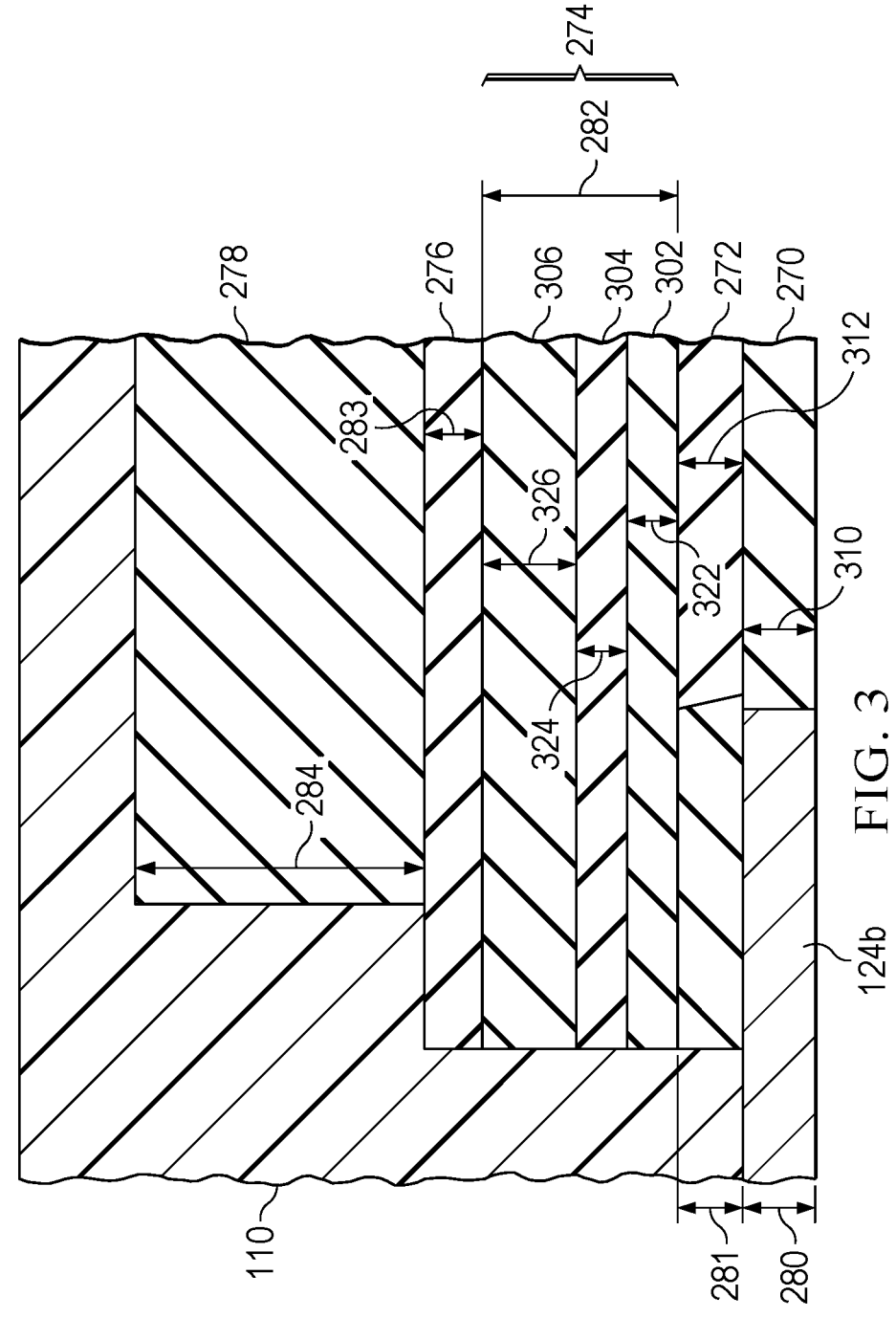
FIG. 3 is a partial cross-sectional view of the IC die including buffer dielectric layers according to some examples.

FIG. 3 shows a partial cross-sectional view of the first IC die 102 including the buffer dielectric layer(s) 274 according to some examples. In the illustrated example, the buffer dielectric layer(s) 274 includes a first dielectric layer 302, a second dielectric layer 304, and a third dielectric layer 306. The first dielectric layer 302 is disposed over the over-layer dielectric (e.g., the first dielectric sub-layer 270 and/or second dielectric sub-layer 272). The second dielectric layer 304 is disposed over the first dielectric layer 302, and the third dielectric layer 306 is disposed over the second dielectric layer 304.

Thicknesses of the various layers are shown for illustration purposes. The first dielectric sub-layer 270 of the over-layer dielectric has a thickness 310, and the second dielectric sub-layer 272 of the over-layer dielectric has a thickness 312. The first dielectric layer 302 of the buffer dielectric layer(s) 274 has a thickness 322. The second dielectric layer 304 of the buffer dielectric layer(s) 274 has a thickness 324. The third dielectric layer 306 of the buffer dielectric layer(s) 274 has a thickness 326.

In some examples, the materials and thicknesses of the various layers are as below in Table 1. These materials and thicknesses are merely an example, and other materials and/or thicknesses may be implemented in other examples.

TABLE 1

| Layer (Thickness) | Material | Thickness |
|---|---|---|
| Polyimide layer 278 (thickness 284) | polyimide | 20 μm |
| Passivation dielectric layer 276 (thickness 283) | SiON | 0.8 μm |
| Third dielectric layer 306 (thickness 326) | SiON | 2.0 μm |
| Second dielectric layer 304 (thickness 324) | TEOS | 1.0 μm |
| First dielectric layer 302 (thickness 322) | TEOS | 0.6 μm |
| Second dielectric sub-layer 272 (thickness 312) | TEOS | 1.5 μm |
| First dielectric sub-layer 270 (thickness 310) | HDP $SiO_x$ | 1.3 μm |
| Capacitor top plate 124b (thickness 280) | Metal | 1.3 μm |

Figure 4:
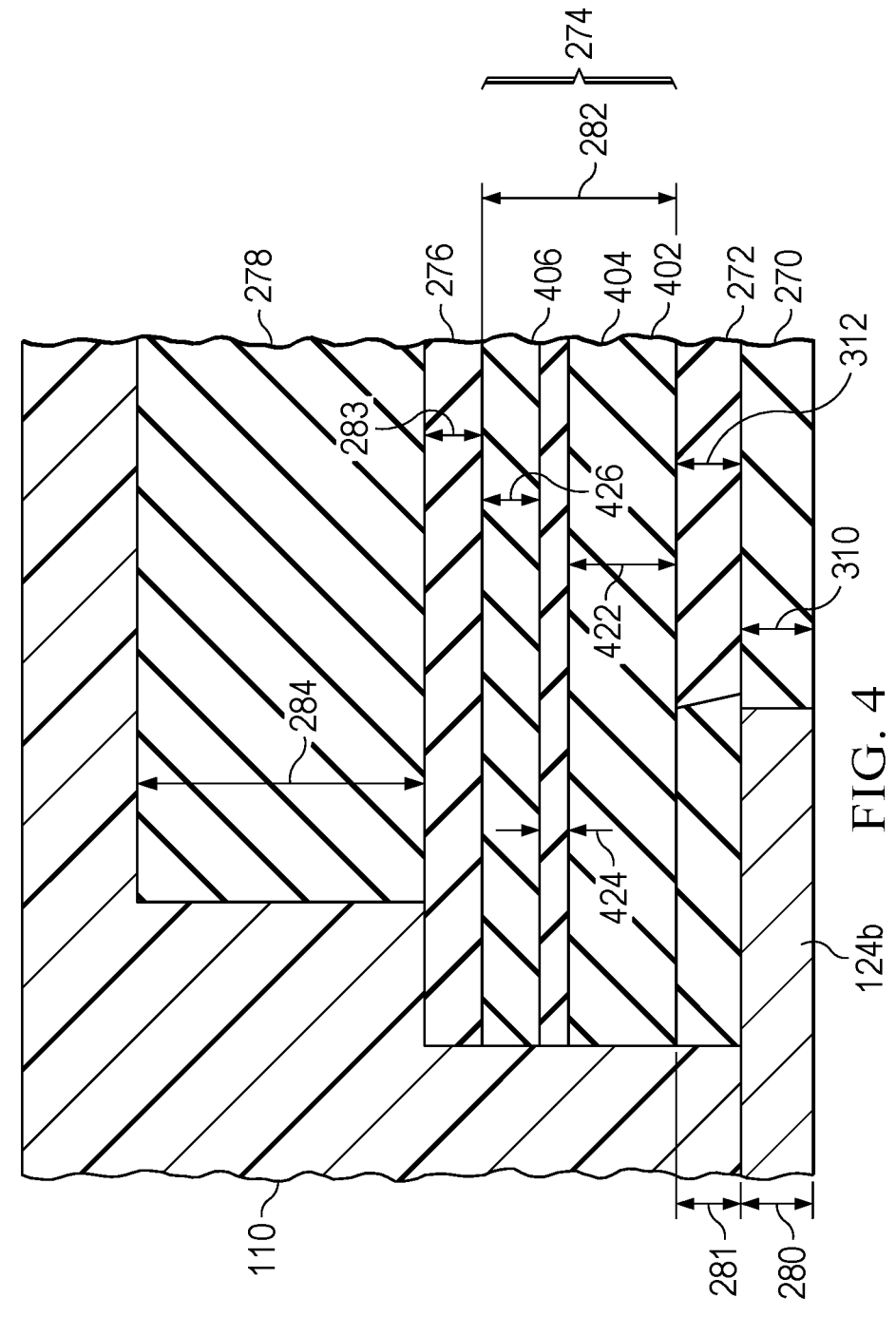
FIG. 4 is a partial cross-sectional view of the IC die including buffer dielectric layers according to some examples.

FIG. 4 shows a partial cross-sectional view of the first IC die 102 including the buffer dielectric layer(s) 274 according to some examples. In the illustrated example, the buffer dielectric layer(s) 274 includes a first dielectric layer 402, a second dielectric layer 404, and a third dielectric layer 406. The first dielectric layer 402 is disposed over the over-layer dielectric (e.g., the first dielectric sub-layer 270 and/or second dielectric sub-layer 272). The second dielectric layer 404 is disposed over the first dielectric layer 402, and the third dielectric layer 406 is disposed over the second dielectric layer 404.

Thicknesses of the various layers are shown for illustration purposes. The first dielectric layer 402 of the buffer dielectric layer(s) 274 has a thickness 422. The second dielectric layer 404 of the buffer dielectric layer(s) 274 has a thickness 424. The third dielectric layer 406 of the buffer dielectric layer(s) 274 has a thickness 426.

In some examples, the materials and thicknesses of the various layers are as below in Table 2. These materials and thicknesses are merely an example, and other materials and/or thicknesses may be implemented in other examples.

TABLE 2

| Layer (Thickness) | Material | Thickness |
|---|---|---|
| Polyimide layer 278 (thickness 284) | polyimide | 20 μm |
| Passivation dielectric layer 276 (thickness 283) | SiON | 0.8 μm |
| Third dielectric layer 406 (thickness 426) | TEOS | 1.6 μm |
| Second dielectric layer 404 (thickness 424) | TEOS | 1.0 μm |
| First dielectric layer 402 (thickness 422) | TEOS | 2.0 μm |
| Second dielectric sub-layer 272 (thickness 312) | TEOS | 1.5 μm |
| First dielectric sub-layer 270 (thickness 310) | HDP SiO$_x$ | 1.3 μm |
| Capacitor top plate 124b (thickness 280) | Metal | 1.3 μm |

In some applications of a galvanic isolation capacitor, particularly in HV applications, a failure mode has been observed due to electric field peaks in the system. In such applications, with the absence of the buffer dielectric layer(s) 274, an electric field realized in the system can be relatively high. This high electric field can result in breakdown of the system, which may result in undesired current flowing through portions of the system to a grounded node, such as on the IC die. Such breakdown can negatively impact the isolation capability of the IC die.

By incorporating one or more buffer dielectric layers 274 as described by the foregoing, the polyimide layer 278 can be a greater distance from the capacitor top plate 124b, which can cause an electric field to be reduced. The reduced electric field can result in a lower likelihood of system breakdown.

In design of an IC die with such a galvanic isolation capacitor that has a target voltage rating, the distance 291 between the capacitor top plate 124b and the polyimide layer 278 can be determined in relation to the distance 290 between the capacitor plates 124a, 124b. The distance 291 can be some percentage of the distance 290 such that the distance 291 is sufficiently large, resulting in breakdown of the dielectric layer(s) between the capacitor plates 124a, 124b being more likely than breakdown of the polyimide layer 278. As an example, in a HV application like described with respect to FIGS. 1, 2, and 4 and Table 2, the distance 290 can be 20.5 μm, and the distance 291 can be 6.9 μm, which is approximately 33.7% of the distance 290. In some examples, the distance 291 is equal to or greater than 30%, equal to or greater than 32%, and/or equal to or greater than 37% of the distance 290. In some examples, the distance 291 is in a range from 30% to 38% of the distance 290.

Figure 5:
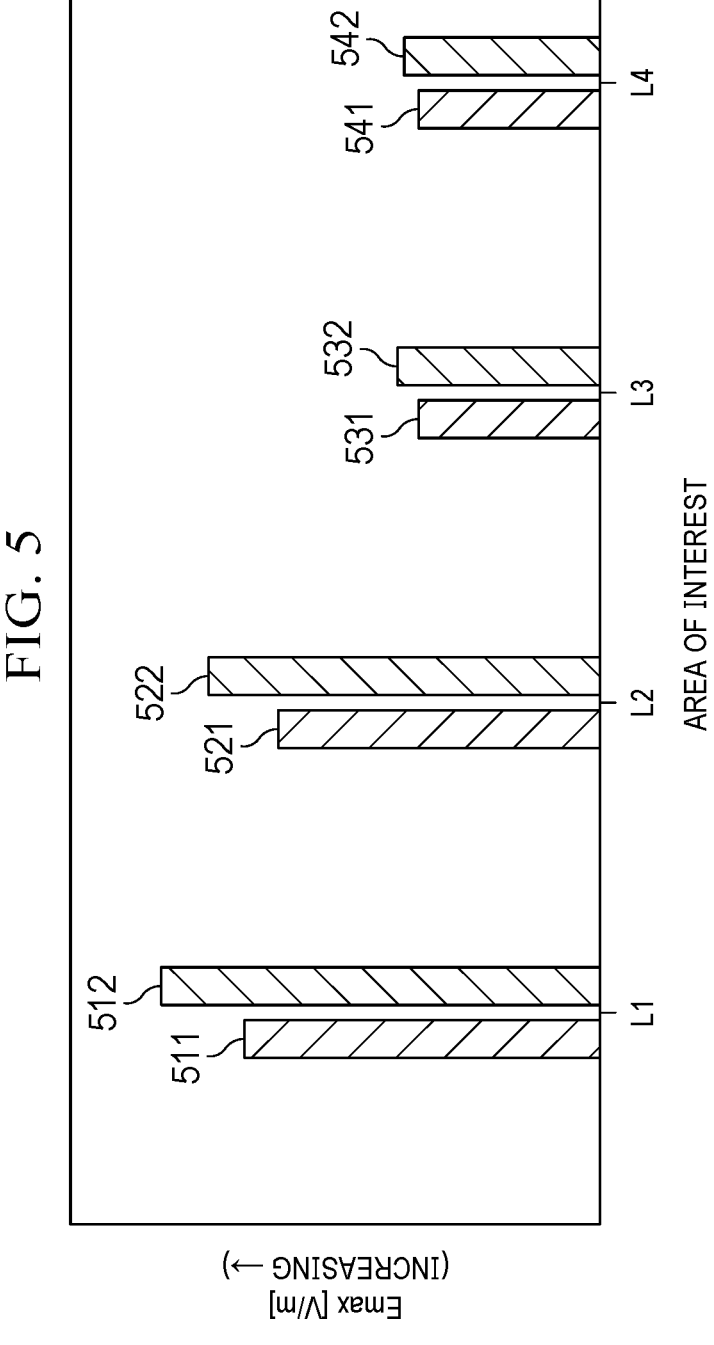
FIGS. 5 and 6 are tables showing results of modeling and simulating an example implementation compared against an application without a buffer dielectric layer.
Figure 6:
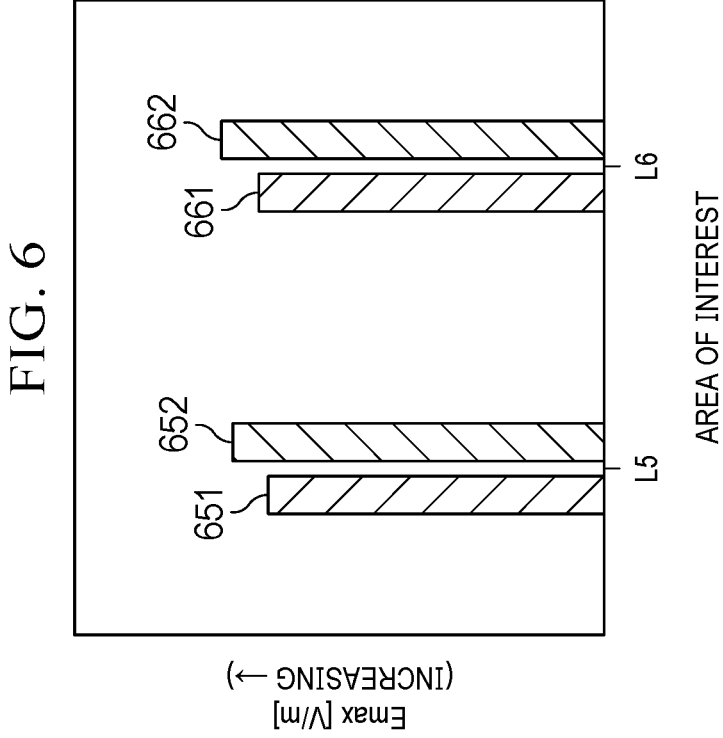

FIGS. 5 and 6 are tables showing results of modeling and simulating an implementation like described with respect to FIGS. 1, 2, and 4 and Table 2 compared against an application without a buffer dielectric layer. Electric field amounts 511, 521, 531, 541, 651, 661 were obtained by simulation at locations L1, L2, L3, L4, L5, L6 in the implementation of FIGS. 1, 2, and 4 and Table 2. The locations L1, L2, L3, L4, L5, L6 are shown in FIG. 2. Generally, the locations L1, L2 are at an interface between the passivation dielectric layer 276 and the polyimide layer 278 aligning vertically with opposite vertical sidewalls of the capacitor top plate 124b. The locations L3, L4 are at an interface between the polyimide layer 278 and molding compound 110 aligning vertically with the opposite vertical sidewalls of the capacitor top plate 124b. The locations L5, L6 are at the over-layer dielectric (e.g., the first dielectric sub-layer 270) at the opposite vertical sidewalls of the capacitor top plate 124b. Similarly, electric field amounts 512, 522, 532, 542, 652, 662 were obtained by simulation at similar, corresponding locations L1, L2, L3, L4, L5, L6 in an implementation with only a dielectric layer of silicon oxynitride (at a thickness of 2 μm) disposed between the over-layer dielectric and the passivation dielectric layer.

As shown by FIGS. 5 and 6, the implementation according to FIGS. 1, 2, and 4 and Table 2 realize reduced electric field amounts 511, 521, 531, 541, 651, 661 relative to the electric field amounts 512, 522, 532, 542, 652, 662 at the locations L1, L2, L3, L4, L5, L6. Accordingly, implementations that implement buffer dielectric layer(s) 274 as described herein can realize lower electric fields at such locations. Generally, increasing the thickness of the buffer dielectric layer(s) 274 can decrease peak electric fields at various locations in the first IC die 102 and IC package 100.

In some examples, one or more dielectric layers of the buffer dielectric layer(s) 274 can have a low dielectric constant (k) value, such as 3.9 or less. Adding a low k-value dielectric layer to the buffer dielectric layer(s) 274 can change (e.g., reduce) the effective k-value of the buffer dielectric layer(s) 274. A dielectric layer having a low k-value, and/or the buffer dielectric layer(s) 274 having a lower effective k-value, can have a lower susceptibility to breakdown. This can increase the isolation capabilities of the buffer dielectric layer(s) 274, and therefore, can reduce the likelihood of the system experiencing a breakdown. An example dielectric material having a k-value of 3.9 or less includes TEOS.

In some examples, the thickness 280 of the capacitor top plate 124b can be increased. Increasing the thickness 280 can increase the distance 292 between the bottom surface of the capacitor top plate 124b (e.g., bottom corners of the capacitor top plate 124b) and the bottom surface of the polyimide layer 278. This can cause the electric field at the interface between the polyimide layer 278 and the passivation dielectric layer 276 to be reduced, which can reduce system breakdown. Further, increasing the thickness 280 can reduce system electric fields, which may reduce early lifetime breakdown.

Additionally, in some examples, the thickness 284 of the polyimide layer 278 can be increased. Increasing the thickness 284 can increase the distance between (a) an interface between (i) the polyimide layer 278 and (ii) the molding compound 110 and (b) the capacitor top plate 124b. This can reduce electric field peaks at portions of the system. In some examples, the thickness 284 can be equal to or greater than 110% of the distance 290, and more particularly, equal to greater than 113% of the distance 290.

Figure 7:
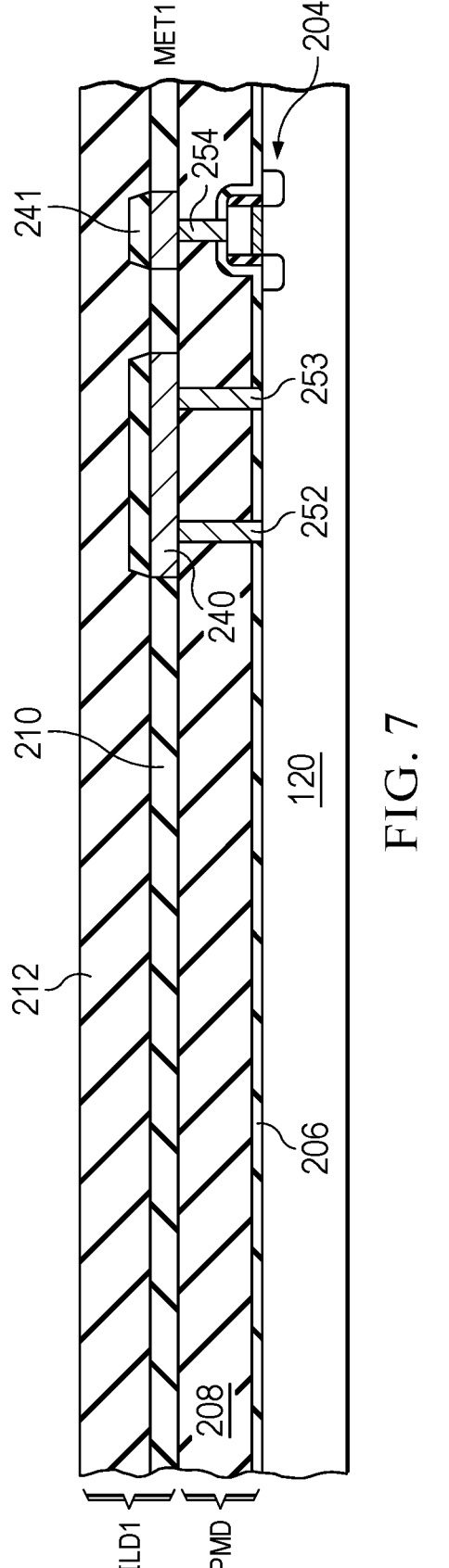
FIGS. 7 through 17 are cross-sectional views during a method of semiconductor processing to form the IC die and the IC package of FIG. 1 according to some examples.

FIGS. 7 through 17 illustrate cross-sectional views during a method of semiconductor processing to form the first IC die 102 and the IC package 100 of FIG. 1. Referring to FIG. 7, front-end-of-the-line (FEOL) processing (e.g., to form a transistor 204) through to the formation of a MET1 is performed on a semiconductor substrate 120. FEOL can include the formation of semiconductor devices (e.g., the transistor 204) in, on, and/or over the semiconductor substrate 120. Then, a PMD is formed over the semiconductor substrate 120. A conformal dielectric layer 206 of the PMD is deposited over the semiconductor substrate, such as by using chemical vapor deposition (CVD), plasma enhanced CVD (PECVD), atomic layer deposition (ALD), or the like. A dielectric layer 208 of the PMD is deposited over the conformal dielectric layer 206, such as by using PECVD, spin-on, or the like. Metal contacts 252-254 can then be formed through the PMD, such as by using processing similar to processing described subsequently with respect to the formation of metal vias. MET1, including metal lines 240, 241, is formed over the PMD, such as using processing similar to processing described subsequently with respect to the formation of other metal levels.

Then, an ILD1 is formed over the PMD and MET1. Forming the ILD1 includes depositing a first dielectric sub-layer 210 over the PMD (e.g., dielectric layer 208) and MET1 (e.g., metal lines 240, 241) and depositing a second dielectric sub-layer 212 over the first dielectric sub-layer 210. The first dielectric sub-layer 210 can be deposited by HDP-CVD or the like, and the second dielectric sub-layer 212 can be deposited by PECVD or the like. A top surface of the second dielectric sub-layer 212 of the ILD1 can be planarized, such as by a chemical mechanical polish (CMP).

Figure 8:
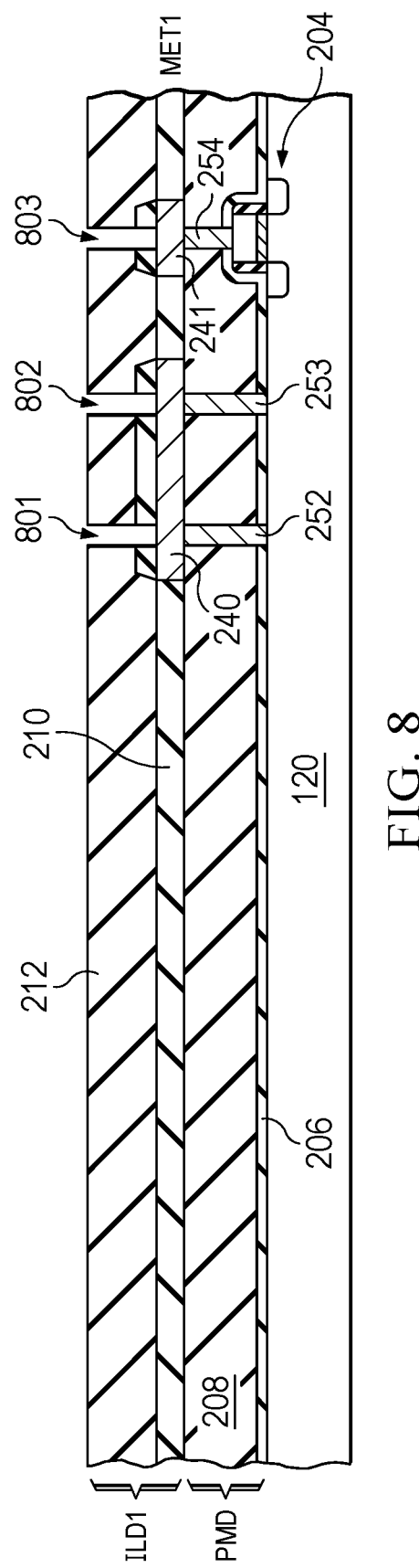

Referring to FIG. 8, openings 801, 802, 803 are formed through the ILD1 (e.g., the second dielectric sub-layer 212 and first dielectric sub-layer 210). The openings 801-803 can be formed using a photolithography process and an etch process, such as a reactive ion etch (RIE). The openings 801, 802 expose the metal line 240, and the opening 803 exposes the metal line 241.

Figure 9:
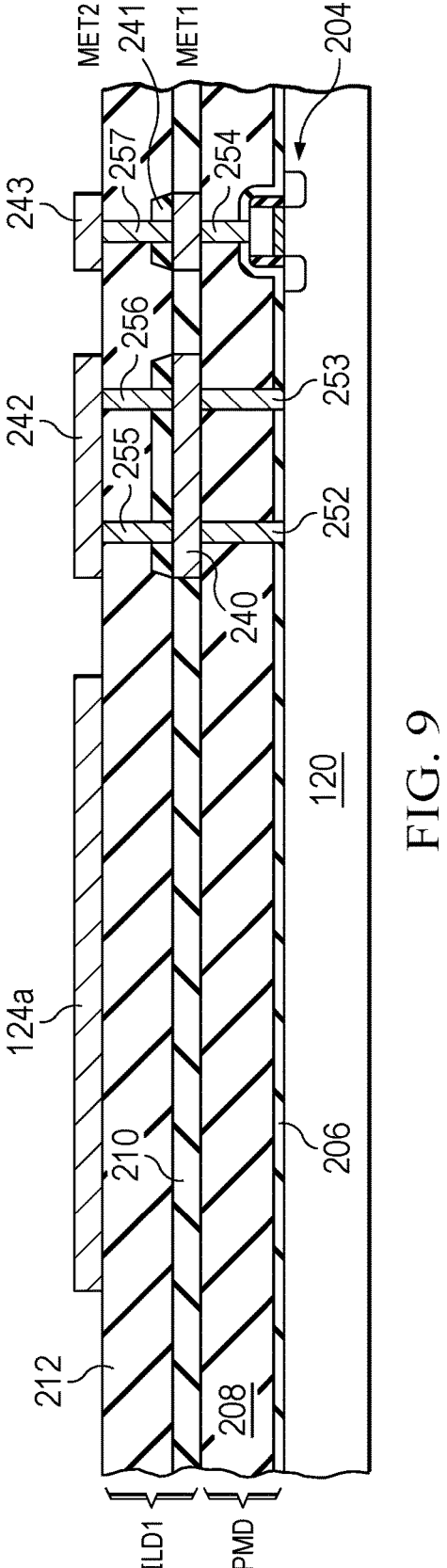

Referring to FIG. 9, metal vias 255, 256, 257 are formed in the openings 801, 802, 803, respectively, through the ILD1, and metal lines 242, 243 and a capacitor bottom plate 124a are formed over the ILD1. An adhesion and/or barrier layer may be conformally deposited, such as by CVD, ALD, or the like, on surfaces of the openings 801-803 and a top surface of the ILD1 (e.g., the second dielectric sub-layer 212), and a metal may be deposited on the adhesion and/or barrier layer, such as by CVD, physical vapor deposition (PVD), or the like. Excess metal over the top surface of the ILD1 may be removed, such as by a CMP, to form the metal vias 255-257. A metal is then deposited on the top surface of the ILD1, such as by CVD, PVD, or the like. The metal can be patterned using a photolithography process and an etch process to have a pattern forming the metal lines 242, 243 and capacitor bottom plate 124a. In various examples, an adhesion and/or barrier layer may be included in the metal lines 242, 243 and capacitor bottom plate 124a, and/or may be omitted in the metal vias 255-257 and/or metal lines 242, 243 and capacitor bottom plate 124a. In other examples, metal lines and/or metal vias may be formed using other processing, such as a dual damascene process.

Figure 10:
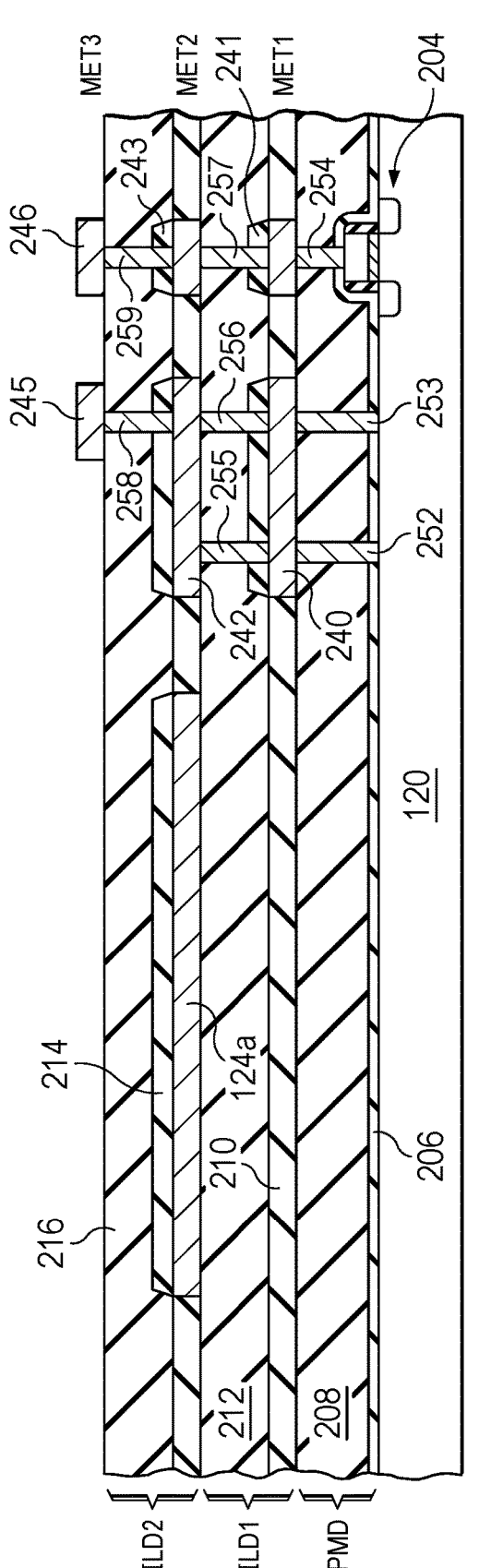

Referring to FIG. 10, ILD2 (including a first dielectric sub-layer 214 and a second dielectric sub-layer 216) and MET3 (including metal lines 245, 246) with metal vias 258, 259 thereunder are formed. The ILD2 is formed like described with respect to the formation of ILD1 in FIG. 7. MET3 and metal vias 258, 259 are formed like described with respect to the formation of MET2 and metal vias 255-257 in FIGS. 8 and 9.

Figure 11:
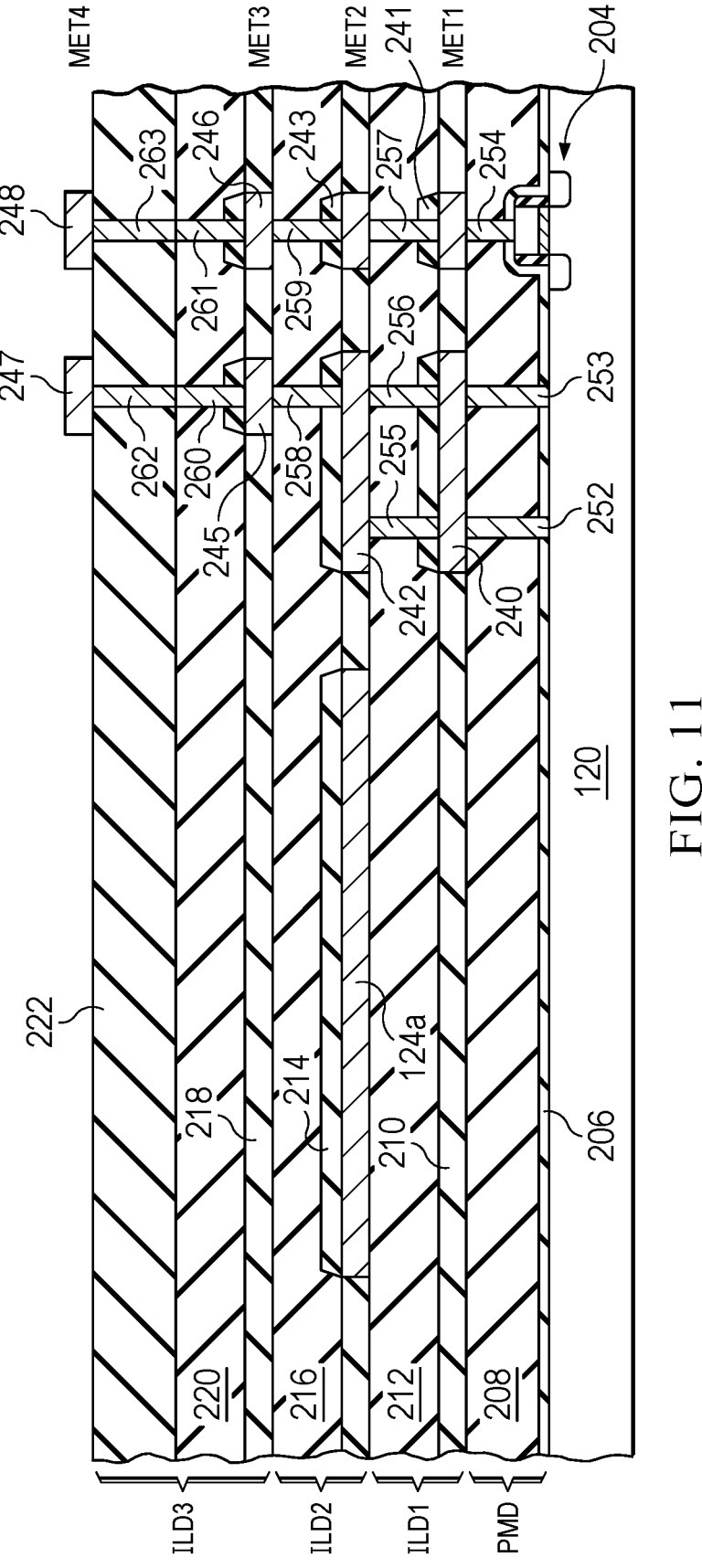

Referring to FIG. 11, ILD3 (including a first dielectric sub-layer 218, a second dielectric sub-layer 220, and a third dielectric sub-layer 222) and MET4 (including metal lines 247, 248) with metal vias 260-263 thereunder are formed. The first dielectric sub-layer 218 and second dielectric sub-layer 220 of the ILD3 are formed like described with respect to the formation of ILD1 in FIG. 7. Openings (not shown) corresponding to where metal vias 260, 261 are to be formed are then formed through the first dielectric sub-layer 218 and second dielectric sub-layer 220 like described with respect to the formation of openings 801-803 in FIG. 8. An adhesion and/or barrier layer may be conformally deposited, such as by PVD, CVD, ALD, or the like, on surfaces of the openings (not shown) and a top surface of the second dielectric sub-layer 220 of ILD3, and a metal may be deposited on the adhesion and/or barrier layer, such as by CVD, PVD, or the like. Excess metal and adhesion and/or barrier layer over the top surface of the second dielectric sub-layer 220 is removed, such as by CMP. Like previously, the adhesion and/or barrier layer may be omitted.

The third dielectric sub-layer 222 is then formed over the second dielectric sub-layer 220 and the metal vias 260, 261. The third dielectric sub-layer 222 can be deposited by PECVD or the like. A top surface of the third dielectric sub-layer 222 of the ILD3 can be planarized, such as by CMP. MET4 and metal vias 262, 263 are formed like described with respect to the formation of MET2 and metal vias 255-257 in FIGS. 8 and 9.

Figure 12:
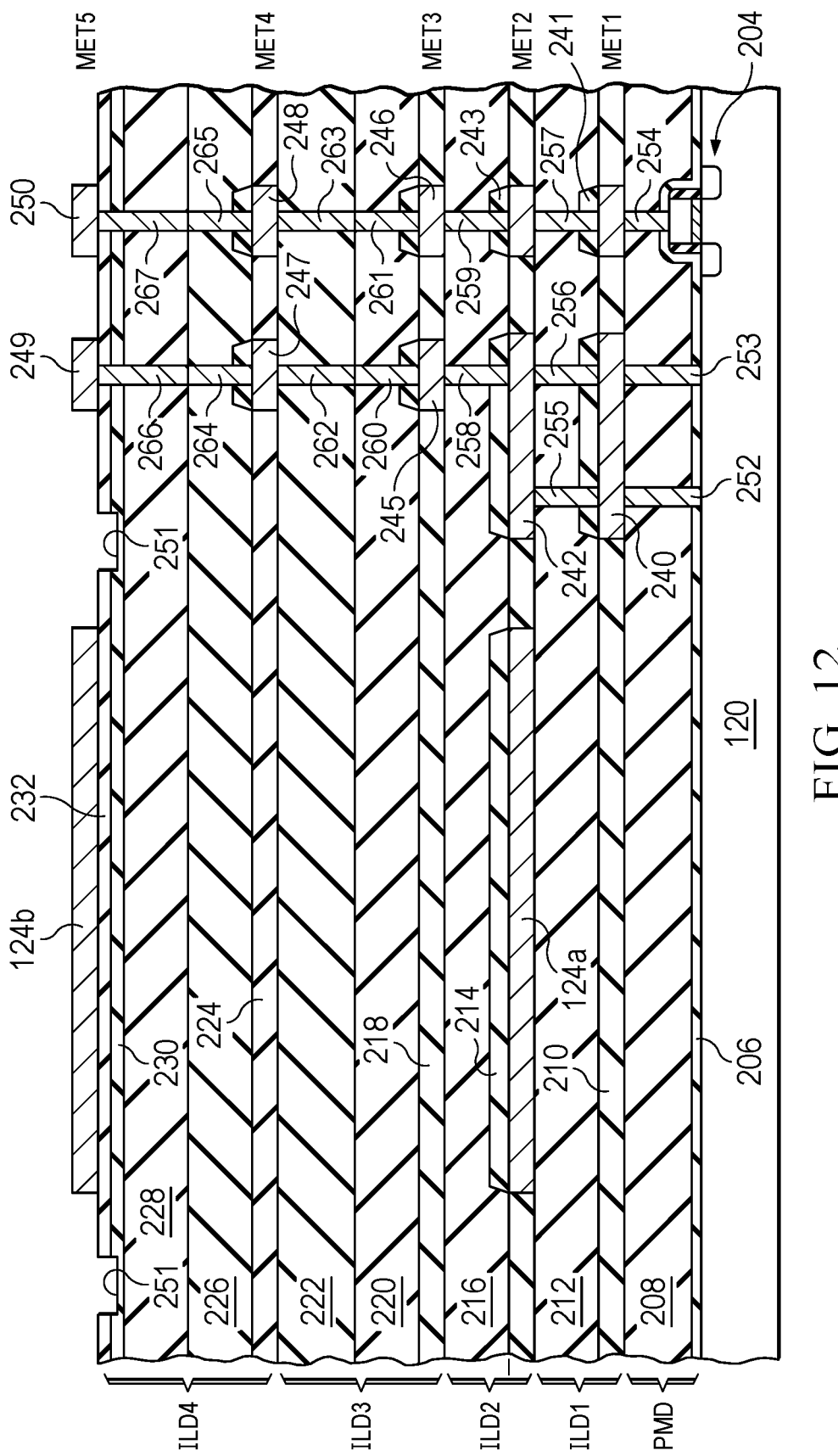

Referring to FIG. 12, ILD4 (including dielectric sub-layers 224, 226, 228, 230, 232) and MET5 (including metal lines 249, 250 and capacitor top plate 124b) with metal vias 264-267 thereunder are formed. The first dielectric sub-layer 224 and second dielectric sub-layer 226 of the ILD4 is formed like described with respect to the formation of ILD1 in FIG. 7. Openings (not shown) corresponding to where metal vias 264, 265 are to be formed are then formed through the first dielectric sub-layer 224 and second dielectric sub-layer 226 like described with respect to the formation of openings 801-803 in FIG. 8. An adhesion and/or barrier layer may be conformally deposited, such as by PVD, CVD, ALD, or the like, on surfaces of the openings (not shown) and a top surface of the second dielectric sub-layer 226 of ILD4, and a metal may be deposited on the adhesion and/or barrier layer, such as by CVD, PVD, or the like. Excess metal and adhesion and/or barrier layer over the top surface of the second dielectric sub-layer 226 is removed, such as by CMP. Like previously, the adhesion and/or barrier layer may be omitted.

The third dielectric sub-layer 228, fourth dielectric sub-layer 230, and fifth dielectric sub-layer 232 are then formed over the second dielectric sub-layer 226 and the metal vias 264, 265. The third dielectric sub-layer 228, fourth dielectric sub-layer 230, and fifth dielectric sub-layer 232 are sequentially deposited. The third dielectric sub-layer 228, fourth dielectric sub-layer 230, and fifth dielectric sub-layer 232 can each be deposited by PECVD or the like. MET5 and metal vias 266, 267 are formed like described with respect to the formation of MET2 and metal vias 255-257 in FIGS. 8 and 9. The trench 251 is then formed in the ILD4 (e.g., extending through the fifth dielectric sub-layer 232 and into the fourth dielectric sub-layer 230), such as by a photolithography process and an etch process.

Figure 13:
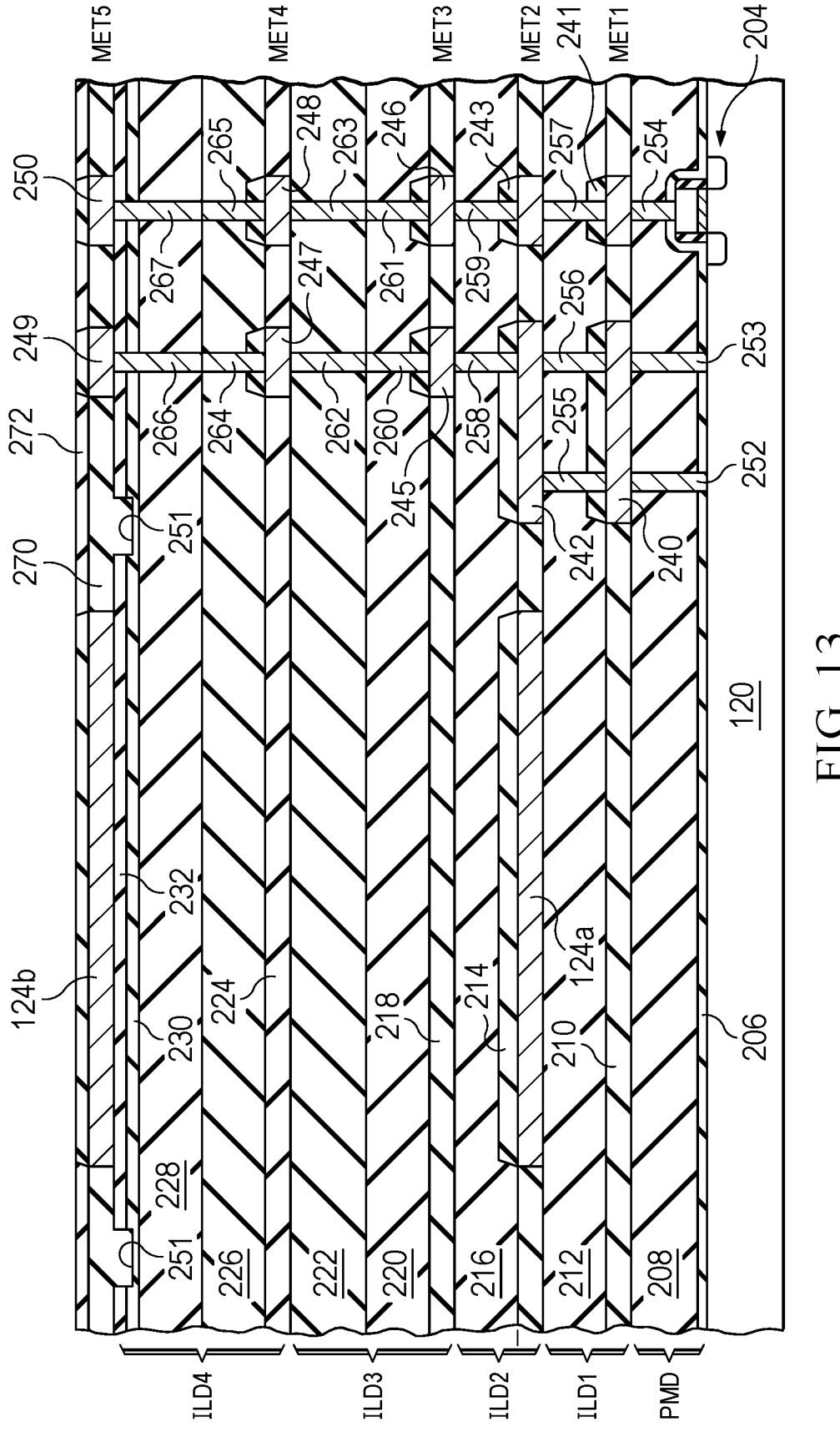

Referring to FIG. 13, an over-layer dielectric (including a first dielectric sub-layer 270 and a second dielectric sub-layer 272) is formed over MET5 and ILD4. Forming the over-layer dielectric includes depositing a first dielectric sub-layer 270 over the ILD4 (e.g., the fifth dielectric sub-layer 232) and MET5 (e.g., metal lines 249, 250 and capacitor top plate 124b) and depositing a second dielectric sub-layer 272 over the first dielectric sub-layer 270. The first dielectric sub-layer 270 fills the trench 251. The first dielectric sub-layer 270 can be deposited by HDP-CVD or the like, and the second dielectric sub-layer 272 can be deposited by CVD, PECVD, or the like. A top surface of the second dielectric sub-layer 272 of the over-layer dielectric can be planarized, such as by CMP. In some examples, a top surface of the first dielectric sub-layer 270 is exposed over the capacitor top plate 124b as a result of the planarization (e.g., the second dielectric sub-layer 272 is removed from directly over the capacitor top plate 124b). In some examples, a portion of the second dielectric sub-layer 272 may remain directly over the capacitor top plate 124b after the planarization.

Figure 14:
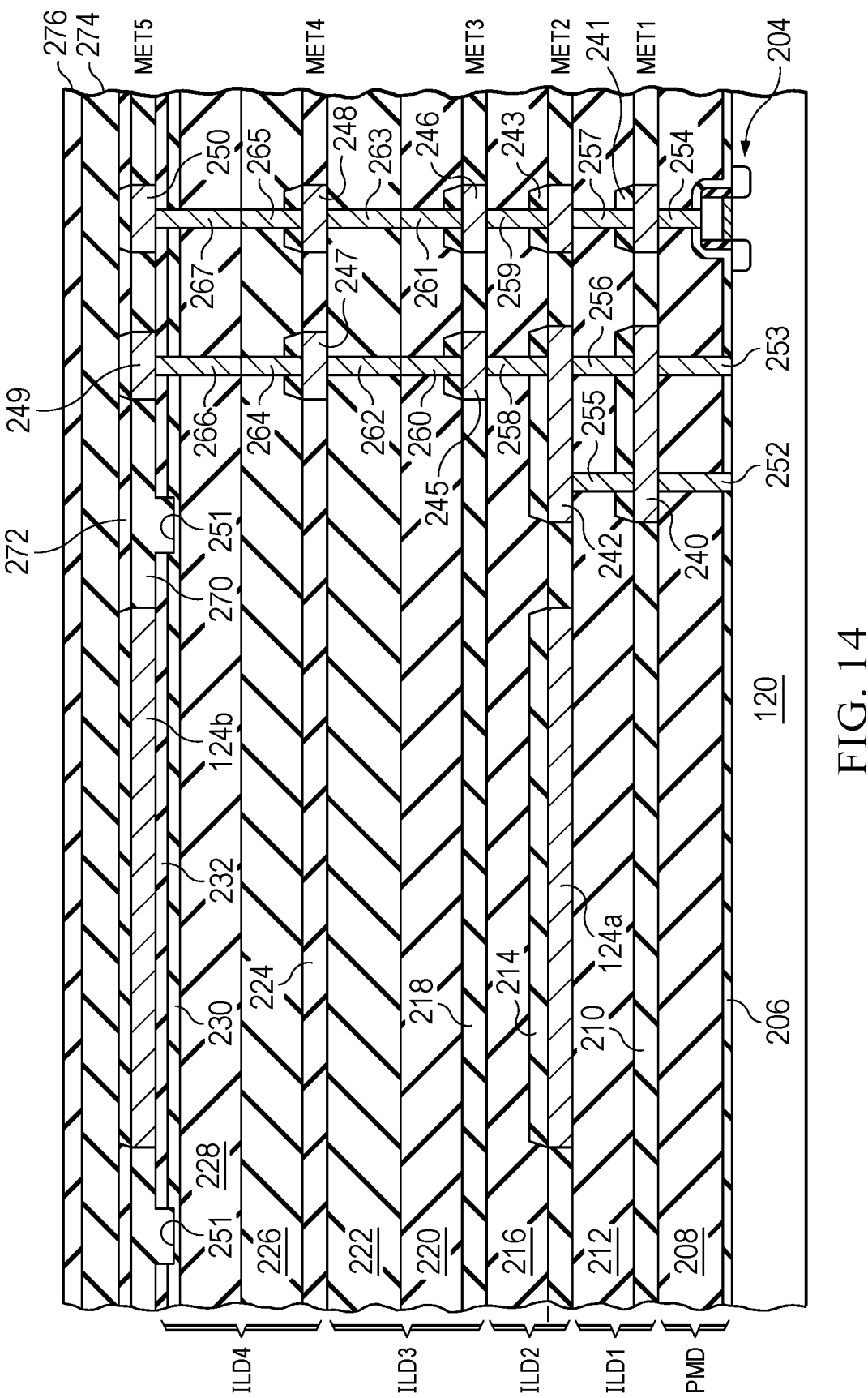

Referring to FIG. 14, one or more buffer dielectric layers 274 are formed over the over-layer dielectric, and the passivation dielectric layer 276 is formed over the buffer dielectric layer(s) 274. In some examples, the buffer dielectric layer(s) 274 include the first dielectric layer 302, the second dielectric layer 304, and the third dielectric layer 306 as shown in FIG. 3. In some examples, the buffer dielectric layer(s) 274 include the first dielectric layer 402, the second dielectric layer 404, and the third dielectric layer 406 as shown in FIG. 4. In these examples, the first dielectric layer 302, 402 is deposited over the over-layer dielectric (e.g., the first dielectric sub-layer 270 and/or second dielectric sub-layer 272); the second dielectric layer 304, 404 is deposited over the first dielectric layer 302, 402; and the third dielectric layer 306, 406 is deposited over the second dielectric layer 304, 404. The dielectric layers 302-306, 402-406 can be deposited by PECVD or the like. In other examples, different dielectric layers and/or a different number of dielectric layers can be implemented as the buffer dielectric layer(s) 274. The passivation dielectric layer 276 is deposited, such as by PECVD or the like, over the buffer dielectric layer(s) 274 (e.g., the third dielectric layer 306, 406).

Figure 15:
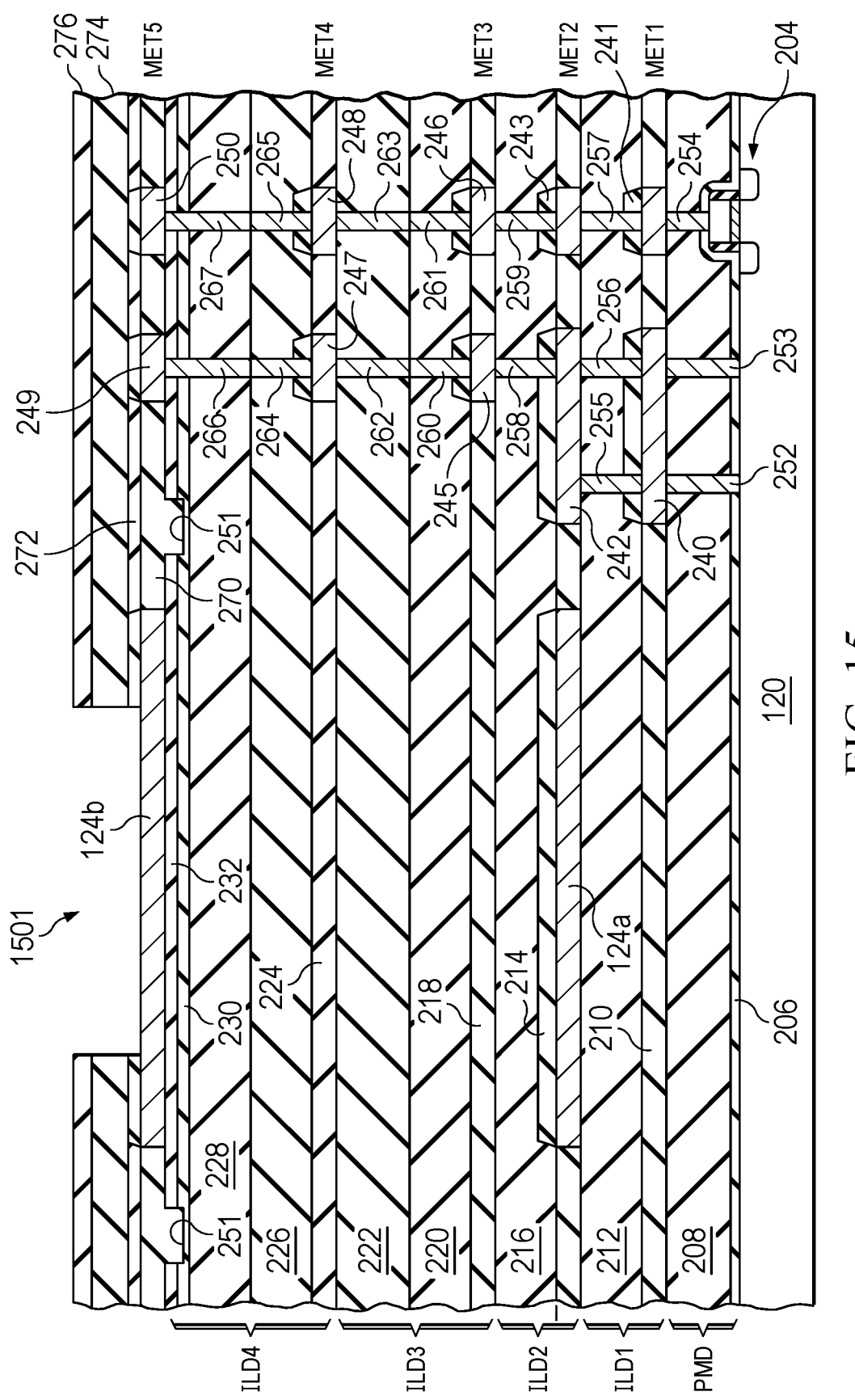

Referring to FIG. 15, an opening 1501 is formed through the passivation dielectric layer 276, the buffer dielectric layer(s) 274, and the over-layer dielectric (e.g., the first dielectric sub-layer 270 and/or second dielectric sub-layer 272) to the capacitor top plate 124b. The opening 1501 can be formed using photolithography and etch processes.

Figure 16:
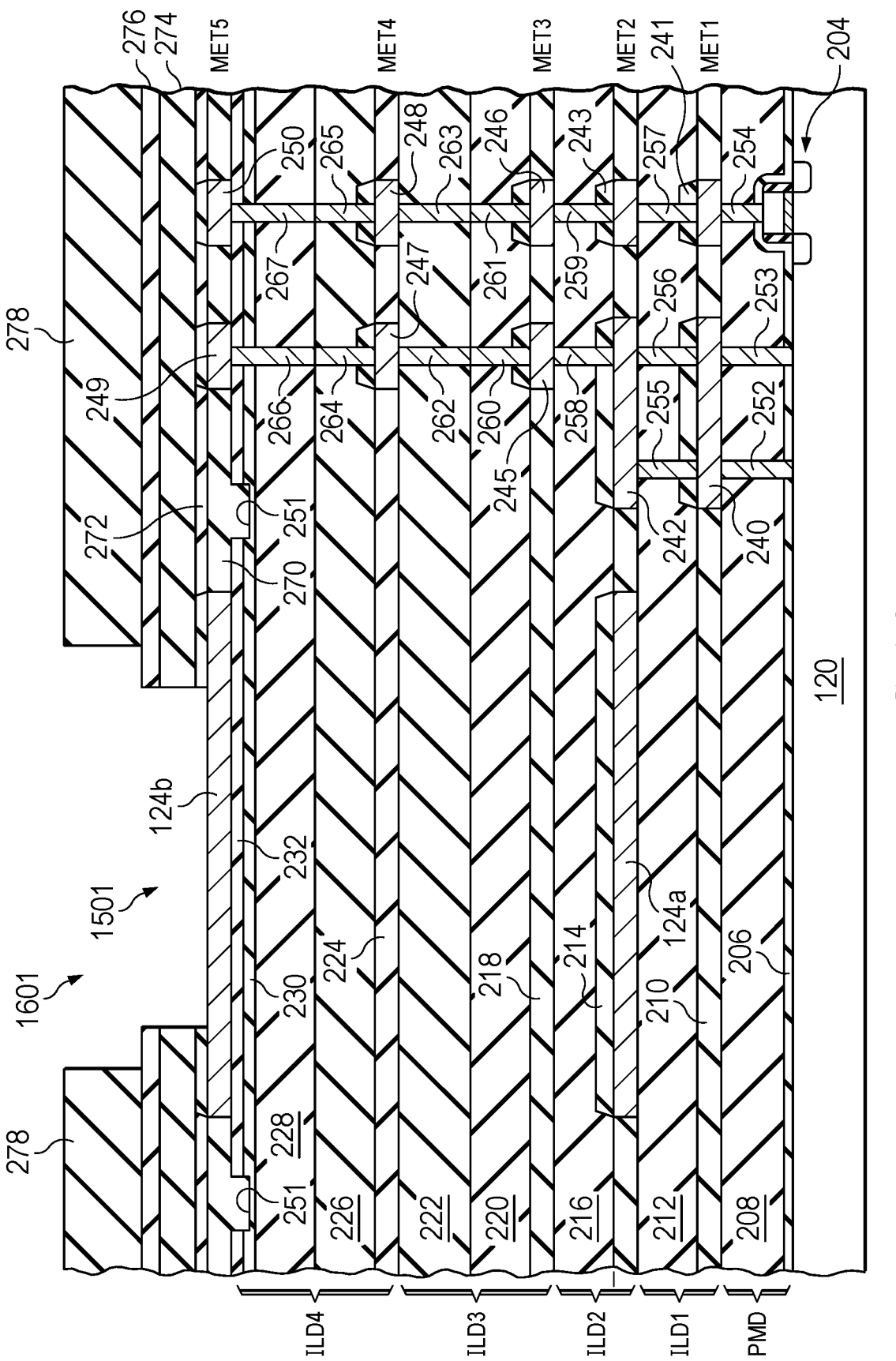

Referring to FIG. 16, a polyimide layer 278 is formed over the passivation dielectric layer 276. In some examples, the polyimide layer 278 can be a photosensitive material deposited by spin on or the like and patterned with an opening 1601 using photolithography. In some examples, such as when the polyimide layer 278 is a thick layer, a multi-pass process can be implemented. For example, a first sub-layer of polyimide can be deposited by spin on, exposed, and developed, and then, a second sub-layer of polyimide can be deposited by spin on, exposed, and developed. The opening 1601 through the polyimide layer 278 corresponds with the opening 1501, and with the opening 1501, the opening 1601 exposes the capacitor top plate 124b.

Figure 17:
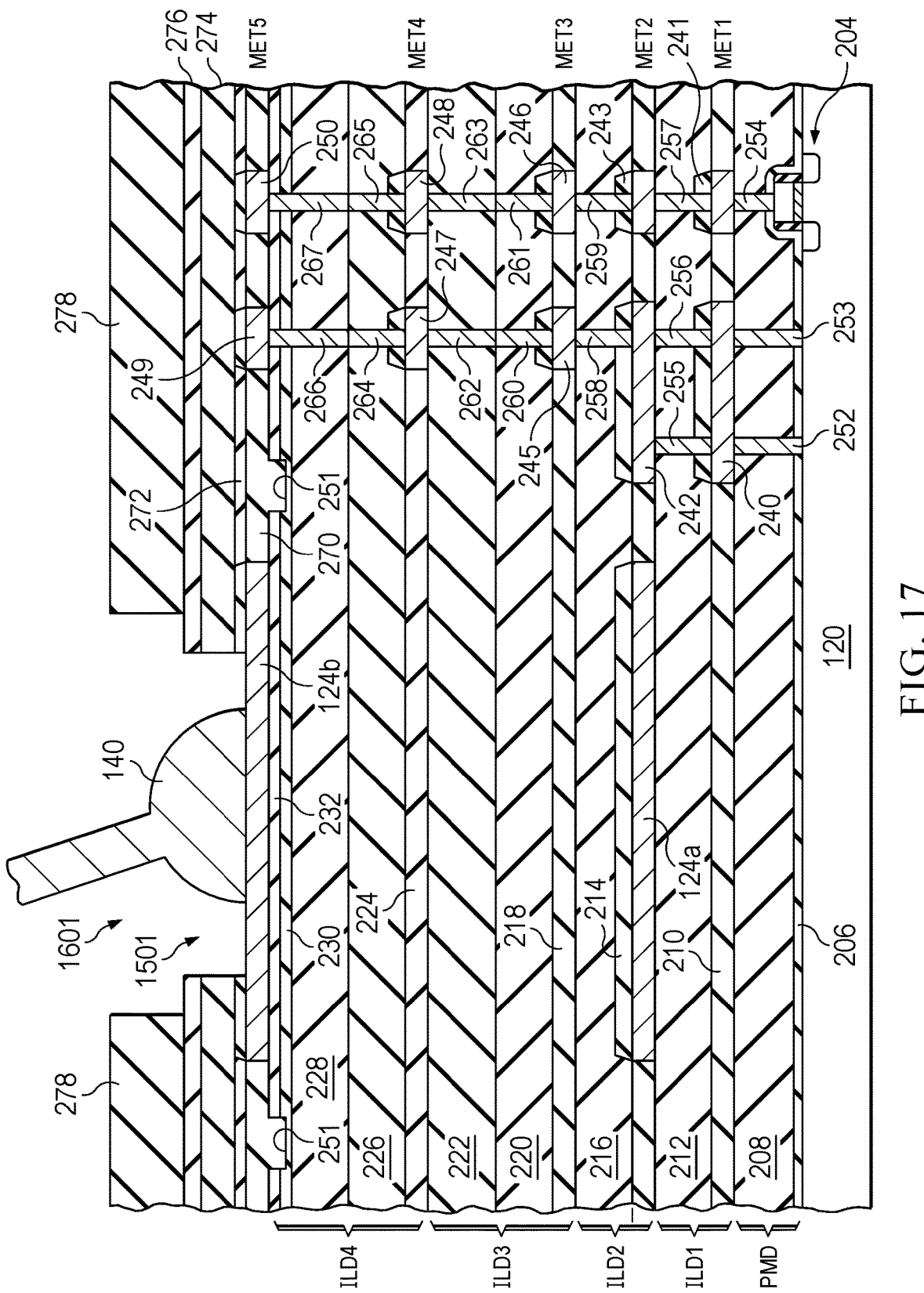

Referring to FIG. 17, the first IC die 102 is singulated from other IC dies that may be formed on a same semiconductor substrate 120 (e.g., wafer). The singulation may be performed by using sawing or dicing. The singulated first IC die 102 is attached to a leadframe 106 using an adhesive. Similarly, a second IC die 104 is attached to the leadframe 106 using an adhesive. A wire bonding process is performed that includes wire bonding wire 140 through the openings 1501, 1601 to the capacitor top plate 124b. The wire 140 has another end that is wire bonded to a bond pad 134 of the second IC die 104. Other wires can be wire bonded from the first IC die 102 and/or the second IC die 104 to leads on the leadframe 106. Subsequently, the first IC die 102 and second IC die 104 attached to the leadframe 106 are encapsulated by a molding compound 110, as shown in FIG. 2.

Although various examples have been described in detail, it should be understood that various changes, substitutions, and alterations can be made therein without departing from the scope defined by the appended claims.

What is claimed is:
1. An integrated circuit (IC) package comprising:
a first IC die comprising:
 a first circuit disposed on a first semiconductor substrate;
 a capacitor comprising:
  a bottom plate disposed over the first semiconductor substrate; and a top plate disposed over the bottom plate, a first distance being from a top surface of the bottom plate to a bottom surface of the top plate; and
 a polyimide layer disposed at least partially over the top plate of the capacitor, a second distance being from a top surface of the top plate to a bottom surface of the polyimide layer, the second distance being equal to or greater than 30% of the first distance; and
a second IC die comprising a second circuit disposed on a second semiconductor substrate, a signal path being electrically coupled between the first circuit and the second circuit, the signal path including the capacitor, the second IC die not including a galvanic isolation capacitor in the signal path,
wherein the first distance is equal to or greater than 15 $\mu$m.
2. The IC package of claim 1, wherein the first IC die further comprises:
an over-layer dielectric disposed at least partially over the top plate of the capacitor, the top plate of the capacitor being disposed in an uppermost metal level distal from the first semiconductor substrate;
one or more buffer dielectric layers disposed over the over-layer dielectric; and
a passivation dielectric layer disposed over the one or more buffer dielectric layers, the polyimide layer being disposed over the passivation dielectric layer.
3. The IC package of claim 2, wherein a buffer dielectric layer of the one or more buffer dielectric layers has a dielectric constant value of 3.9 or less.
4. The IC package of claim 2, wherein the one or more buffer dielectric layers comprises:
a first dielectric layer disposed over the over-layer dielectric;
a second dielectric layer disposed over the first dielectric layer; and
a third dielectric layer disposed over the second dielectric layer, the passivation dielectric layer being disposed over the third dielectric layer.
5. The IC package of claim 4, wherein:
the first dielectric layer is a first layer of tetraethyl orthosilicate (TEOS);
the second dielectric layer is a second layer of TEOS; and
the third dielectric layer is a layer of silicon oxynitride.
6. The IC package of claim 4, wherein:
the first dielectric layer is a first layer of tetraethyl orthosilicate (TEOS);
the second dielectric layer is a second layer of TEOS; and
the third dielectric layer is a third layer of TEOS.
7. The IC package of claim 1 further comprising a wire bonded to the first IC die and the second IC die, the wire being bonded to the top plate of the capacitor through the polyimide layer, the signal path including the wire.
8. A method of semiconductor processing, the method comprising:
forming a first capacitor plate on a first interlayer dielectric (ILD), the first ILD being disposed over a semiconductor substrate;
forming a second capacitor plate on a second ILD, the second ILD being disposed over the first capacitor plate and the first ILD, a first distance being from a top surface of the first capacitor plate to a bottom surface of the second capacitor plate, the first distance being equal to or greater than 15 $\mu$m; and
forming a polyimide layer over the second capacitor plate and the second ILD, a second distance being from a top surface of the second capacitor plate to a bottom surface of the polyimide layer, the second distance being equal to or greater than 30% of the first distance.

9. The method of claim 8 further comprising:

forming an over-layer dielectric over the second ILD and at least partially over the second capacitor plate, the second capacitor plate being disposed in an uppermost metal level distal from the semiconductor substrate;

forming one or more buffer dielectric layers over the over-layer dielectric; and forming a passivation dielectric layer over the one or more buffer dielectric layers, the polyimide layer being disposed over the passivation dielectric layer.

10. The method of claim 9, wherein forming the one or more buffer dielectric layers comprises:

forming a first dielectric layer over the over-layer dielectric;

forming a second dielectric layer over the first dielectric layer; and forming a third dielectric layer over the second dielectric layer, the passivation dielectric layer being disposed over the third dielectric layer.

11. The method of claim 8, wherein the second distance is equal to or greater than 32% of the first distance.

12. The method of claim 8, wherein the second distance is in a range from 30% to 38% of the first distance.

13. The method of claim 8 further comprising bonding a wire to the second capacitor plate through an opening through the polyimide layer.

14. An integrated circuit (IC) die comprising:

a galvanic isolation capacitor comprising:

a bottom plate over a semiconductor substrate; and a top plate over the bottom plate, a first distance being from a top surface of the bottom plate to a bottom surface of the top plate, the first distance being equal to or greater than 15 μm; and a polyimide layer over the top plate of the galvanic isolation capacitor, a second distance being from a top surface of the top plate to a bottom surface of the polyimide layer, the second distance being equal to or greater than 30% of the first distance.

15. The IC die of claim 14 further comprising:

a first interlayer dielectric (ILD) disposed over the semiconductor substrate, the bottom plate being disposed on the first ILD;

a second ILD disposed over the bottom plate and the first ILD, the top plate being disposed on the second ILD, the top plate being disposed in an uppermost metal level;

an over-layer dielectric disposed over the second ILD and at least partially over the top plate;

one or more buffer dielectric layers disposed over the over-layer dielectric; and a passivation dielectric layer disposed over the one or more buffer dielectric layers, the polyimide layer being disposed over the passivation dielectric layer.

16. The IC die of claim 14, wherein the second distance is equal to or greater than 32% of the first distance.

17. The IC die of claim 14, wherein the second distance is equal to or greater than 37% of the first distance.

18. The IC die of claim 14, wherein the second distance is in a range from 30% to 38% of the first distance.

19. The IC die of claim 14, wherein a thickness of the polyimide layer is equal to or greater than 110% of the first distance.

20. An integrated circuit (IC) package comprising:

a first IC die comprising:

a first circuit disposed on a first semiconductor substrate;

a capacitor comprising:

a bottom plate disposed over the first semiconductor substrate; and a top plate disposed over the bottom plate, a first distance being from a top surface of the bottom plate to a bottom surface of the top plate; and a polyimide layer disposed at least partially over the top plate of the capacitor, a second distance being from a top surface of the top plate to a bottom surface of the polyimide layer, the second distance being equal to or greater than 30% of the first distance; and a second IC die comprising a second circuit disposed on a second semiconductor substrate, a signal path being electrically coupled between the first circuit and the second circuit, the signal path including the capacitor, the second IC die not including a galvanic isolation capacitor in the signal path, wherein the first IC die further comprises:

an over-layer dielectric disposed at least partially over the top plate of the capacitor, the top plate of the capacitor being disposed in an uppermost metal level distal from the first semiconductor substrate;

one or more buffer dielectric layers disposed over the over-layer dielectric; and a passivation dielectric layer disposed over the one or more buffer dielectric layers, the polyimide layer being disposed over the passivation dielectric layer.

* * * * *